(12) United States Patent
Jun et al.

(10) Patent No.: US 8,831,533 B2
(45) Date of Patent: Sep. 9, 2014

(54) METHOD AND APPARATUS FOR NON-CALIBRATED AUTOMATIC FREQUENCY CORRECTION OF A PORTABLE TERMINAL

(75) Inventors: In-Tae Jun, Daegu (KR); Young-Nam Cho, Gumi-si (KR); Ho-Nam Kim, Gumi-si (KR); Jae-Young Roh, Gumi-si (KR); Jae-Young Yun, Gumi-si (KR)

(73) Assignee: Samsung Electronics Co., Ltd (KR)

( * ) Notice: Subject to any disclaimer, the term of this patent is extended or adjusted under 35 U.S.C. 154(b) by 238 days.

(21) Appl. No.: 13/350,152

(22) Filed: Jan. 13, 2012

(65) Prior Publication Data

US 2012/0184224 A1    Jul. 19, 2012

(30) Foreign Application Priority Data

Jan. 13, 2011    (KR) .................. 10-2011-0003731

(51) Int. Cl.
*H04B 1/06*    (2006.01)

(52) U.S. Cl.
USPC .......................................... 455/75

(58) Field of Classification Search
CPC ....................................................... H04B 1/06
USPC ............... 455/525, 526, 561, 62, 115.3, 134, 455/161.3, 226.2
See application file for complete search history.

(56) References Cited

U.S. PATENT DOCUMENTS

| | | | |
|---|---|---|---|
| 8,111,189 B2* | 2/2012 | Abraham et al. | 342/357.62 |
| 8,306,491 B2* | 11/2012 | Der et al. | 455/173.1 |
| 8,400,358 B2* | 3/2013 | Alles et al. | 342/451 |
| 2007/0153944 A1* | 7/2007 | Kerstenbeck et al. | 375/344 |
| 2009/0286493 A1* | 11/2009 | Viaud et al. | 455/90.2 |
| 2009/0291686 A1* | 11/2009 | Alpert et al. | 455/436 |
| 2012/0115423 A1* | 5/2012 | Sang et al. | 455/75 |
| 2013/0035099 A1* | 2/2013 | Boejer et al. | 455/436 |

* cited by examiner

*Primary Examiner* — Andrew Wendell
*Assistant Examiner* — Maryam Soltanzadeh
(74) *Attorney, Agent, or Firm* — The Farrell Law Firm, P.C.

(57) ABSTRACT

An apparatus and method for non-calibrated Automatic Frequency Correction (AFC) of a portable terminal are provided. The method includes identifying, by the portable terminal, signal strengths of signals received from neighboring base stations of a cell in which the portable terminal is currently located; searching for a frequency burst serving that provides synchronization acquisition information for synchronization with a base station; determining to perform the AFC according to a result of the searching for the frequency burst; and storing AFC data extracted through the AFC.

13 Claims, 3 Drawing Sheets

METHOD AND APPARATUS FOR NON-CALIBRATED AUTOMATIC FREQUENCY CORRECTION OF A PORTABLE TERMINAL

PRIORITY

This application claims the priority under 35 U.S.C. §119 (a) to Korean Application Serial No. 10-2011-0003731, which was filed in the Korean Industrial Property Office on Jan. 13, 2011, the content of which is hereby incorporated by reference.

BACKGROUND OF THE INVENTION

1. Field of the Invention

The present invention relates generally to non-calibrated Automatic Frequency Correction (AFC) of a portable terminal, and more particularly, to a method and an apparatus for non-calibrated AFC of a portable terminal where AFC based on a result of a search for a frequency burst can be performed by monitoring the frequency burst.

2. Description of the Related Art

Conventional Radio Frequency (RF) correction is performed for optimizing an output power of a portable terminal during its manufacturing process. This type of RF correction is performed before releasing the portable terminal due to tolerances of analog devices in an RF circuit of the portable terminal.

However, because the RF correction is performed before releasing the portable terminal, an RF switch connector, which is unnecessary after the release of the portable terminal, is inserted into an end of the RF circuit, requiring a separate RF correction time and causing additional costs.

Further, when a memory of the portable terminal is reset after releasing of a portable terminal, e.g., due to a mistake of a user, an RF correction value is also reset or deleted at the same time. Consequently, the portable terminal cannot be provided with a service until RF correction is performed again.

SUMMARY OF THE INVENTION

Accordingly, the present invention has been made to solve at least the above-mentioned problems occurring in the prior art, and to provide at least the advantages described below.

An of the present invention is to provide a method and an apparatus for non-calibrated AFC of a portable terminal, by which a portable terminal can monitor a frequency burst, before a camping-on by the portable terminal, and perform self AFC, based on a result of a search for the frequency burst.

In accordance with an aspect of the present invention, a method for non-calibrated AFC of a portable terminal is provided. The method includes identifying, by the portable terminal, signal strengths of signals received from neighboring Base Stations (BSs) of a cell in which the portable terminal is currently located; searching for a frequency burst serving that provides synchronization acquisition information for synchronization with a base station; determining to perform the AFC according to a result of the searching for the frequency burst; and storing AFC data extracted through the AFC.

In accordance with another aspect of the present invention, an apparatus for non-calibrated AFC of a portable terminal is provided. The apparatus includes a wireless communication unit for communicating with a base station; a control unit for identifying signal strengths of signals received from neighboring base stations in a cell in which the portable terminal is currently located using a signal output from the wireless communication unit, searching for a frequency burst that provides synchronization acquisition information to perform the AFC according to a result searching for the frequency burst, and storing AFC data extracted through the AFC; and an RF correction unit for generating a control signal for performing the AFC under the control of the control unit.

BRIEF DESCRIPTION OF THE DRAWINGS

The above and other aspects, features, and advantages of the present invention will be more apparent from the following detailed description taken in conjunction with the accompanying drawings, in which.

DETAILED DESCRIPTION OF EMBODIMENTS OF THE INVENTION

Various embodiments of the present invention will be described below with reference to the accompanying drawings. In the following description, various specific definitions are provided to assist with a general understanding of the present invention, and it will be understood by those skilled in the art that various changes in form and details may be made therein without departing from the spirit and scope of the present invention as defined by the appended claims.

The present invention relates generally to non-calibrated AFC. More particularly, the present invention proposes a technology where a frequency burst for providing synchronization acquisition information for synchronization with a BS is monitored, before a camping-on by a portable terminal, while identifying strengths of signals received from neighboring BSs for searching for a serving BS to perform AFC, based on a result of the search for the frequency burst. Extracted AFC data for frequency synchronization with a serving BS is then stored, making it possible to remove the separate time and costs for performing conventional RF correction during a manufacturing process.

Also, it will be apparent that a portable terminal described herein may include many information/communication devices and multimedia devices such as a digital broadcasting terminal, a Personal Digital Assistant (PDA), a smart phone, a 3G terminal such as an International Mobile Telecommunication (IMT)-2000 terminal, a Wideband Code Division Multiple Access (WCDMA) terminal, a Global System for Mobile communication General Packet Radio Service (GSM/GPRS) terminal, and a Universal Mobile Telecommunication Service (UMTS) terminal, and applications thereof.

Figure 1:
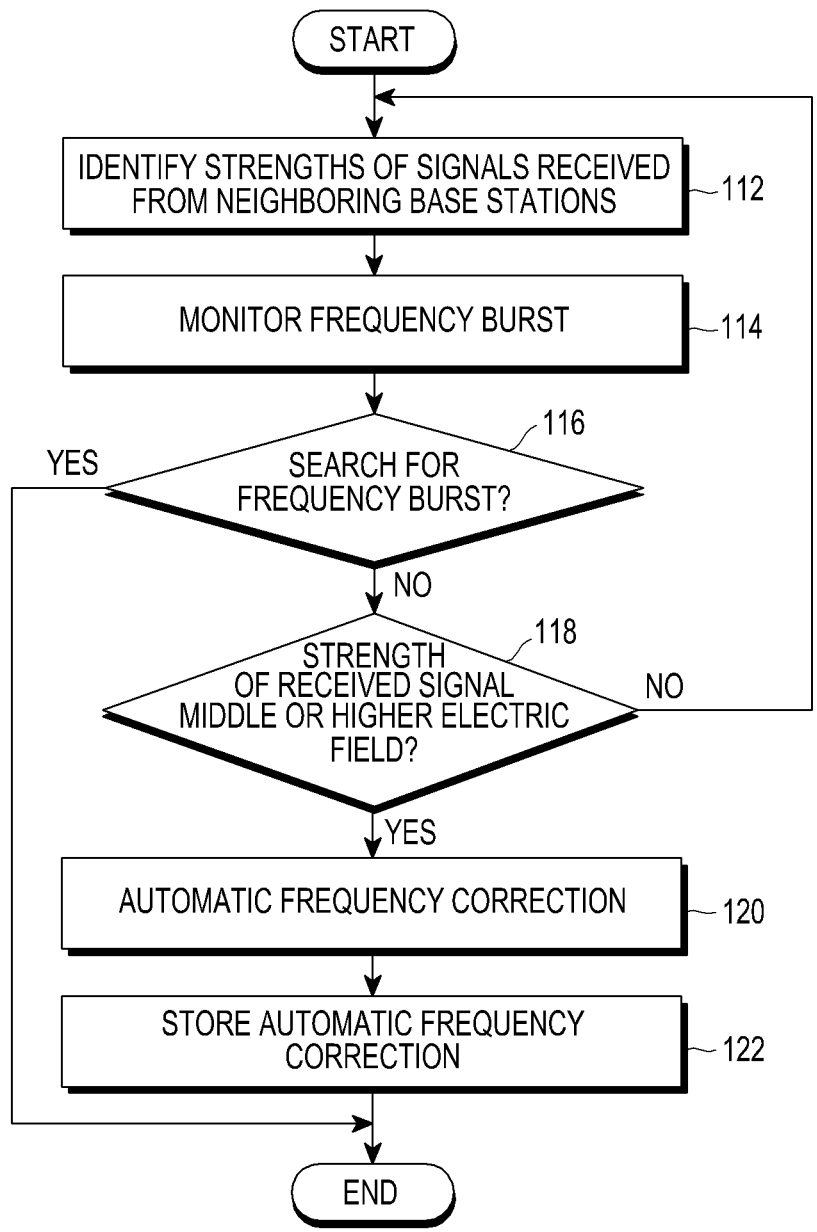
FIG. 1 is a flowchart illustrating a method of non-calibrated AFC of a portable terminal according to an embodiment of the present invention.

FIG. 1 is a flowchart illustrating a method of non-calibrated AFC of a portable terminal according to an embodiment of the present invention.

Referring to FIG. 1, in step 112, the portable terminal identifies strengths of signals received from neighboring BSs of a cell in which the portable terminal is currently located, in order for the portable terminal to receive a service from a BS whose signal strength, i.e., electric field, is highest. A neighbor BS with the highest signal strength, i.e., which is physically closest to the cell where the portable terminal is located, is selected as a serving BS that will provide the portable terminal with a service.

In step 114, the portable terminal monitors a frequency burst for providing synchronization acquisition information for synchronization with the BS. The monitoring is implemented in a physical layer, which is interface between the portable terminal and transmitted data, and the frequency burst is a signal used for synchronization between a BS and a portable terminal in a mobile communication system. Additionally, the monitoring is implemented before a camping-on by the portable terminal.

In step 116, the portable terminal determines whether or not the frequency burst is searched for through the monitoring of step 114. When the frequency burst is not searched, the portable terminal proceeds to step 118. When the frequency burst is searched, the portable terminal ends the method of non-calibrated AFC. This step is performed for the portable terminal to detect the frequency burst and to monitor whether a received signal having a predetermined level is input at a predetermined frequency in a cell in which the portable terminal is currently located, to identify a signal having a highest level of those among the monitored received signals in units of a predetermined block time of the received signal. Synchronization is acquired by decoding received a synchronization burst.

In step 118, the portable terminal determines whether a strength of a signal received from the neighboring BSs pertains to a middle or higher electric field.

When it is determined that a strength of a received signal is a middle or higher electric field, AFC is performed in step 120. Step 120 is performed when a frequency burst is not searched for despite a strength of a received signal from a BS belonging to a middle or higher electric field, and a frequency burst is searched for by plus/minus(+/−)-crossing a value of an AFC Digital-to-Analog Converter (DAC).

Figure 3:
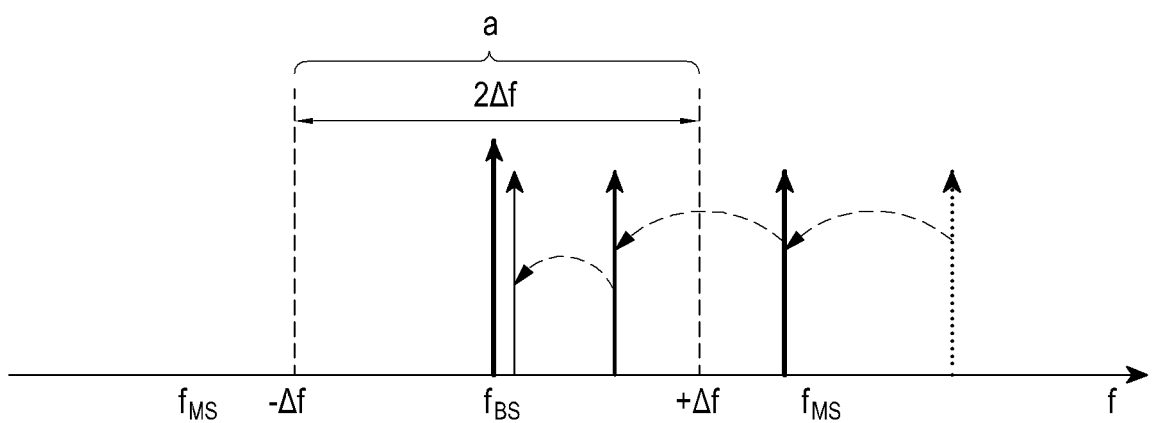
FIG. 3 is a graph illustrating an AFC Digital-to-Analog Converter (DAC) value according to an embodiment of present invention.

A plus/minus(+/−)-crossing of an AFC value is illustrated in the graph of FIG. 3.

Referring to FIG. 3, $f_{MS}$ denotes a frequency generated by a same channel portable terminal, $f_{BS}$ denotes a frequency generated by a same channel BS, and a, i.e., 2Δf denotes a range in which the portable terminal can detect an $f_{BS}$ of a BS. As illustrated in FIG. 3, the plus/minus(+/−)-crossing of the AFC DAC value is a process of frequency-hopping an $f_{BS}$ in a broadcast channel, which is transmitted downstream from a serving BS in a period of 51 mfs (multi-frames).

Referring back to FIG. 1, in step 122, AFC data extracted by the AFC is stored in a Non-Volatile Random Access Memory (NVRAM).

The AFC data stored in NVRAM is referenced as an important factor for optimizing frequency synchronization in a wireless communication through a portable terminal of a user later, and is used as an optimized frequency correction value for performing frequency synchronization with the serving BS, when the serving BS is changed due to the movement of the portable terminal, such that the portable terminal does not perform RF correction separately.

After step 122, the portable terminal sorts the signals received from the neighboring BSs in an ascending order of their strengths, selects a BS whose signal strength is highest as a serving BS, and requests for a Frequency correction CHannel (FCH) for frequency synchronization and a Synchronization CHannel (SCH) for time synchronization from the selected serving BS to receive a BS Identification Code (BSIC).

Figure 2:
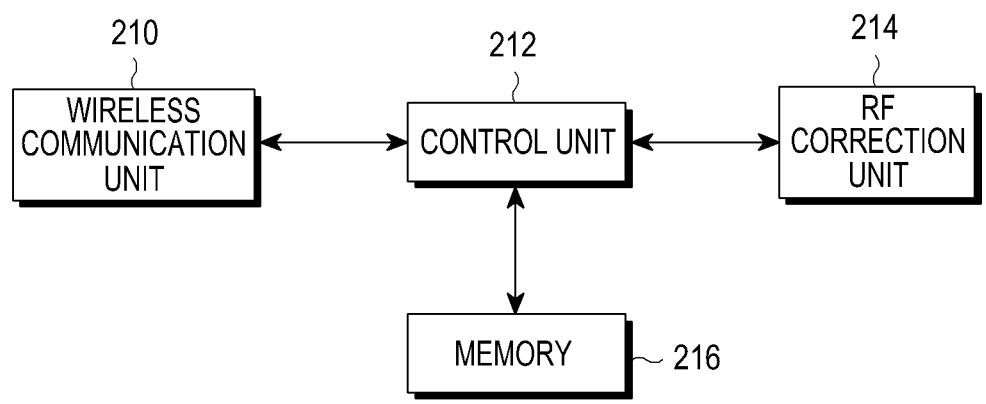
FIG. 2 is a block diagram illustrating an apparatus for non-calibrated AFC of a portable terminal according to an embodiment of the present invention.

FIG. 2 is a block diagram illustrating an apparatus for non-calibrated automatic frequency correction of a portable terminal according to an embodiment of the present invention.

Referring to FIG. 2, the portable terminal includes a wireless communication unit 210, a control unit 212, an RF correction unit 214, and a memory 216. The wireless communication unit 210 includes a Receiver (Rx) and a Transmitter (Tx), and communicates with a BS using wireless signals. That is, the wireless communication unit 210 receives a wireless downlink signal, and outputs downlink data obtained by demodulating the wireless downlink signal to the control unit 212. Further, the wireless communication unit 210 modulates uplink data input from the control unit 212 to generate a wireless uplink signal, and wirelessly transmits the generated wireless uplink signal. For example, the modulation and demodulation may be performed in schemes of Code Division Multiple Access (CDMA), Frequency Division Multiplexing (FDM), and Time Division Multiplexing (TDM).

The RF correction unit 214 generates a control signal for AFC under the control of the control unit 212.

The memory 216 stores processing and control programs for the control unit 212, and stores AFC data according to an embodiment of the present invention.

The control unit 212 controls an overall operation of the portable terminal. Particularly, according to an embodiment of the present invention, the control unit 212 identifies strengths of signals received from neighboring BSs in a cell in which the portable terminal is current located using a signal output from the wireless communication unit 210, searches for a frequency burst for providing synchronization acquisition information and performs AFC according to a result of a search for a frequency burst, controls the memory 216 to store AFC data extracted through the AFC in the memory 216, and, when a serving BS of the portable terminal is later changed, reads out the AFC data from the memory 216 to use it for frequency synchronization with the changed serving BS.

When the control unit 212 fails to catch a network despite a signal strength of the signal of the serving BS pertaining to an electric field by which the network can be caught, it performs AFC. The AFC is performed by plus/minus(+/−)-crossing an AFC DAC value.

Also, the control unit 212 performs a controlling operation so that a frequency burst is monitored during a camping-on of the portable terminal, and the stored AFC data is used to perform frequency synchronization with the changed serving BS, when the serving BS is changed.

Further, the control unit 212 performs a controlling operation so that the signals received from the neighboring BSs are sorted out in an ascending order of strengths, a BS whose signal strength is highest is selected, and an FCH for frequency synchronization and an SCH for time synchronization from the selected serving BS are requested to receive a BSIC.

According to the above-described embodiments of the present invention, a frequency burst is monitored before a camping-on by a portable terminal to perform AFC according to a result of a search for the frequency burst and to store extracted AFC data. Further, the stored AFC data is used during frequency synchronization with a serving BS for the portable terminal to perform AFC by itself. This avoids additional time and costs for performing RF correction during a manufacturing process. Further, because an RF switch for the RF correction is removed in an aspect of required hardware, the portable terminal is lighter and manufacturing costs are reduced.

While the present invention has been shown and described with reference to certain embodiments thereof, it will be understood by those skilled in the art that various changes in form and details may be made therein without departing from the spirit and scope of the present invention as defined by the appended claims.

What is claimed is:

1. A method for non-calibrated Automatic Frequency Correction (AFC) in a portable terminal, the method comprising:
    searching for a frequency burst that provides synchronization acquisition information for synchronization with a base station;
    performing a non-calibrated AFC when no frequency burst is found; and
    storing AFC data extracted through the non-calibrated AFC.

2. The method of claim 1, wherein a strength of a signal received from a serving base station is identified through the non-calibrated AFC, and the non-calibrated AFC is performed when the identified strength of the signal pertains to an electric field which meets a network selection condition, prior to a network being selected.

3. The method as claimed in claim 1, wherein the non-calibrated AFC is performed by plus/minus(+/−)-crossing an AFC Digital-to-Analog Converter (DAC) value.

4. The method of claim 1, wherein searching for the frequency burst is performed in a physical layer that is interface between the portable terminal and transmission data.

5. The method of claim 1, wherein searching for the frequency burst is performed before a camping-on by the portable terminal.

6. The method of claim 1, further comprising:
    sorting out the signals received from the neighboring base stations in an ascending order of the signal strengths;
    selecting a neighboring base station whose signal strength is highest as a serving base station; and
    receiving a base station identification code by requesting a frequency correction channel for frequency synchronization and a synchronization channel for time synchronization from the serving base station.

7. The method of claim 1, wherein when a serving base station changes, the stored AFC data is used for frequency synchronization with the changed serving base station.

8. An apparatus for non-calibrated Automatic Frequency Correction (AFC) in a portable terminal, the apparatus comprising:
    a wireless communication unit for communicating with a base station;
    a control unit for searching for a frequency burst that provides synchronization acquisition information to perform the non-calibrated AFC when no frequency burst is found, and storing AFC data extracted through the non-calibrated AFC; and
    a Radio Frequency (RF) correction unit for generating a control signal for performing the non-calibrated AFC under the control of the control unit.

9. The apparatus of claim 8, wherein the control unit identifies a strength of a signal received from a serving base station, and performs the non-calibrated AFC, when the identified signal strength pertains to an electric field that meets a network selection condition, prior to a network being selected.

10. The apparatus of claim 8, wherein the control unit performs the non-calibrated Automatic Frequency Correction (AFC) by plus/minus(+/−)-crossing an AFC Digital-to-Analog Converter (DAC) value.

11. The apparatus of claim 8, wherein the control unit searches for the frequency burst before a camping-on by the portable terminal.

12. The apparatus of claim 8, wherein the control unit sorts out the signals received from the neighboring base stations in an ascending order of the signal strengths, selects a neighboring base station whose signal strength is highest as a serving base station, and receives a base station identification code by requesting a frequency correction channel for frequency synchronization and a synchronization channel for time synchronization from the serving base station.

13. The apparatus of claim 8, wherein the control unit performs a controlling operation so that when a serving base station changes, the stored AFC data is used for frequency synchronization with the changed serving base station.

\* \* \* \* \*